(12) United States Patent
Hino

(10) Patent No.: US 6,195,269 B1
(45) Date of Patent: Feb. 27, 2001

(54) NOISE SUPPRESSING APPARATUS

(75) Inventor: Akira Hino, Sagamihara (JP)

(73) Assignee: I-Pex Co., LTD, Tokyo (JP)

( * ) Notice: Subject to any disclaimer, the term of this patent is extended or adjusted under 35 U.S.C. 154(b) by 0 days.

(21) Appl. No.: 09/329,367

(22) Filed: Jun. 10, 1999

(30) Foreign Application Priority Data

Jun. 12, 1998 (JP) .................................................. 10-165330

(51) Int. Cl.[7] .................................................... H05K 9/00
(52) U.S. Cl. ........................ 361/816; 361/825; 361/818; 174/35 R; 333/12
(58) Field of Search .................................... 361/749, 752, 361/758, 800, 810, 816, 818, 825, 801; 174/35 R, 35 MS; 333/12, 181; 206/719; 248/65, 30 D, 301; 24/298

(56) References Cited

U.S. PATENT DOCUMENTS

| | | | | |
|---|---|---|---|---|
| 5,095,296 | * | 3/1992 | Parker | 333/12 X |
| 5,351,017 | * | 9/1994 | Yano et al. | 333/12 |
| 5,709,249 | * | 1/1998 | Okada et al. | 174/68.3 |

* cited by examiner

Primary Examiner—Jayprakash N. Gandhi
(74) Attorney, Agent, or Firm—Diller, Ramik & Wight, PC

(57) ABSTRACT

Noise suppressing apparatus comprises a pair of case plates on which surface ferrite plates are secured, which are engaged with each other while a plate-shaped noise generating component such as a flexible printed circuit board or a flat cable is placed between them, so that the installation operation of the noise suppressing apparatus to the noise generating component is easier and the noise suppressing apparatus is thinner.

14 Claims, 5 Drawing Sheets

NOISE SUPPRESSING APPARATUS

BACKGROUND OF THE INVENTION

1. Field of the Invention

The present invention relates to a noise suppressing apparatus which blocks the leakage of electromagnetic noise generated from a plate-shaped noise generating component, such as a flexible printed circuit board (FPC) or a flat cable (FC).

2. Description of the Related Art

In an electronic equipment, such as a computer, a plate-shaped noise generating component, such as a flexible printed circuit board (hereafter FPC) or a flat cable (hereafter FC) is generally disposed, and the plate-shaped noise generating component may generate strong electromagnetic noise locally by the influence of signals passing through it.

If the electromagnetic noise is locally generated from a plate-shaped noise generating component, the leakage of the electromagnetic noise may cause malfunctions to other electronic devices disposed around the noise generating component.

To prevent leakage of electromagnetic noise generated from such a plate-shaped noise generating component as FPC or FC, a part where the electromagnetic noise is generated is covered with a noise suppressing apparatus, which reduces the influence of electromagnetic noise leaked from the plate-shaped noise generating component as much as possible.

This conventional noise suppressing apparatus is constituted by an integratedly molded ferrite of rectangular shape in which a hole to insert the plate-shaped FPC or FC is formed.

To mount the noise suppressing apparatus onto a plate-shaped noise generating component such as FPC or FC, it is necessary first to insert the FPC or FC into the hole of the noise suppressing apparatus before the FPC or FC is assembled into the electronic equipment, position the noise suppressing apparatus at a part of the FPC or FC, and connect the FPC or FC on which the noise suppressing apparatus has been mounted to a terminal such as a connector.

With the conventional noise suppressing apparatus constituted by integratedly molded ferrite, however, the noise suppressing apparatus must be attached to a part of the FPC or FC where an electromagnetic noise is leaking before connecting the FPC or FC to the terminal such as a connector. Therefore, if it is found that electromagnetic noise is leaking another part of the FPC or FC after connecting the FPC or FC to the terminal, it is necessary that the FPC or FC is detached from the terminal, and then the noise suppressing apparatus is attached to this another part of the FPC or FC where electromagnetic noise is actually leaking, and the FPC or FC is connected to the terminal again. Thus, the conventional apparatus has a problem in that the operation to attach the noise suppressing apparatus at a different part of the FPC or FC after connecting the FPC or FC to the terminal is extremely troublesome.

Further, for the conventional noise suppressing apparatus constituted by integratedly molded ferrite, it is difficult to manufacture a thin rectangular ferrite having a hole inside by the ferrite molding process. As a consequence, it is impossible to mount the conventional noise suppressing apparatus in a small space of slim electronic equipment, such as a notebook personal computer.

SUMMARY OF THE INVENTION

With the foregoing in view, it is an object of the present invention to provide a noise suppressing apparatus having a small thickness, and capable of being easily attached to a plate-shaped noise generating component.

To solve the above problems, a noise suppressing apparatus according to the present invention, which covers top and bottom faces of a plate-shaped noise generating component so as to prevent leakage of electromagnetic noise generated from the noise generating component, comprises a pair of case plates on a surface of which a ferrite plate is secured respectively; and latching means for engaging and locking the pair of case plates in a position where the ferrite plate of each of the pair of case plates are facing each other, wherein the pair of case plates are disposed on top and bottom faces of the noise generating component, the pair of case plates are latched by the latching means to cover a part of the top and bottom faces of the noise generating component with the ferrite plate secured to each of the case plate, so that the leakage of electromagnetic noise generated from the covered part is prevented.

DESCRIPTION OF THE PREFERRED EMBODIMENTS

Embodiments of a noise suppressing apparatus in accordance with the present invention are described below.

Figure 1:
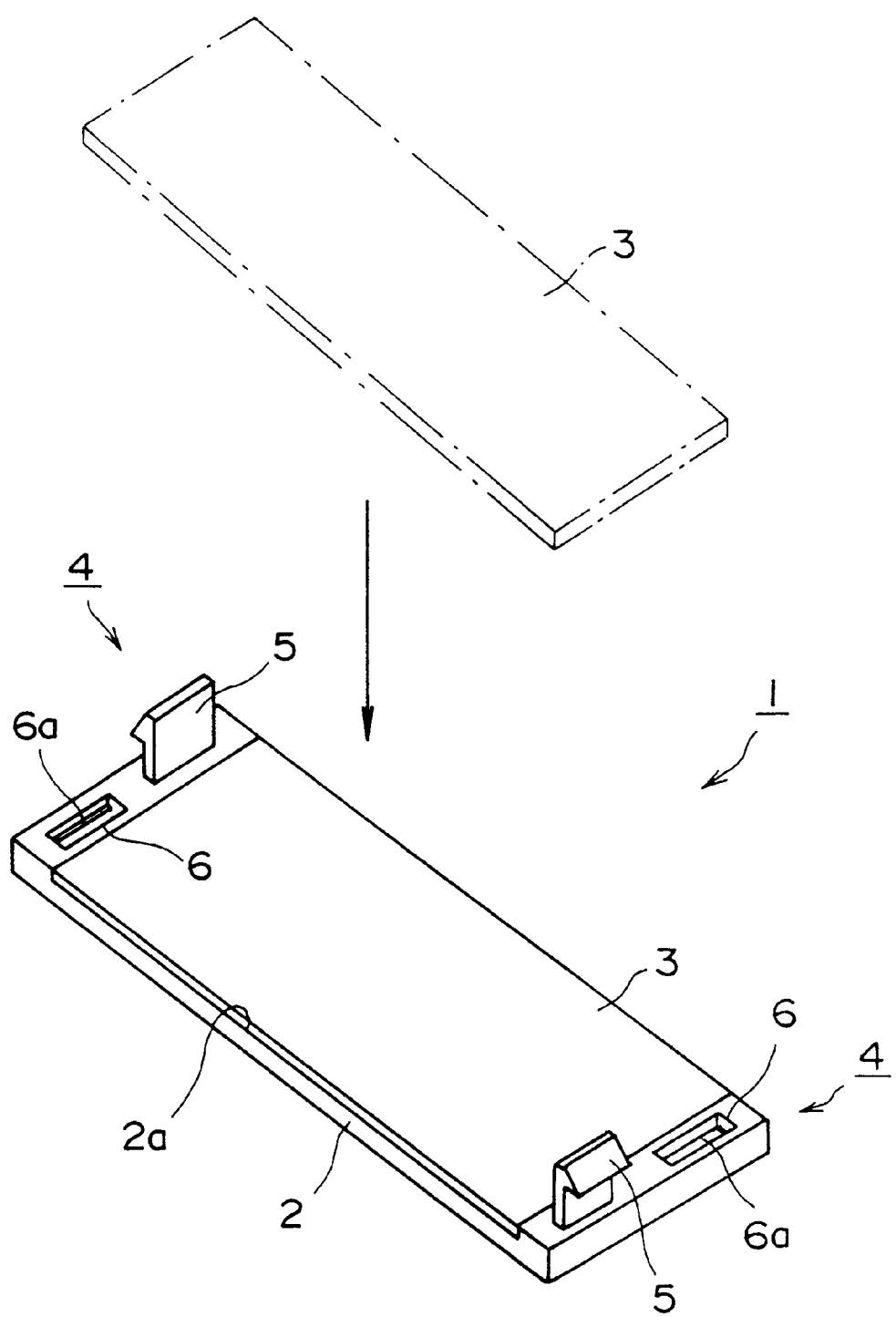
FIG. 1 is a schematic perspective view of a noise suppressing apparatus in accordance with an embodiment of the present invention.

FIG. 1 is a schematic perspective view of a noise suppressing apparatus 1 in accordance with an embodiment of the present invention.

The noise suppressing apparatus 1 comprises a case plate 2 made from such synthetic resin as plastic, and a thin plate-shaped ferrite plate 3, which is glued on the top face of the case plate 2.

The ferrite plate 3 is secured with gluing means, such as double sided tape, which is not illustrated here, in a concave part 2a formed on the top face of the case plate 2.

Securing of the ferrite plate 3 and the case plate 2 is not limited to the gluing means such as double sided tape, but fastening means such as screws may be used.

Latching means 4 for connecting a pair of case plates 2 to each other is provided on both sides of the case plate 2.

The latching means 4 is for approaching each surface of the pair of case plates 2 on which the ferrite plates 3 are secured while each surface faces each other, so as to connect both of the plates, and the latching means 4 comprise latches 5 and latch holes 6 with which the latches 5 engage. In the latch holes 6, step parts 6a are formed for the latches 5 to engage.

Next, how the noise suppressing apparatus 1 is applied and the functions thereof are described.

A pair of the case plates 2 where ferrite plates 3 are glued are prepared.

Figure 2:
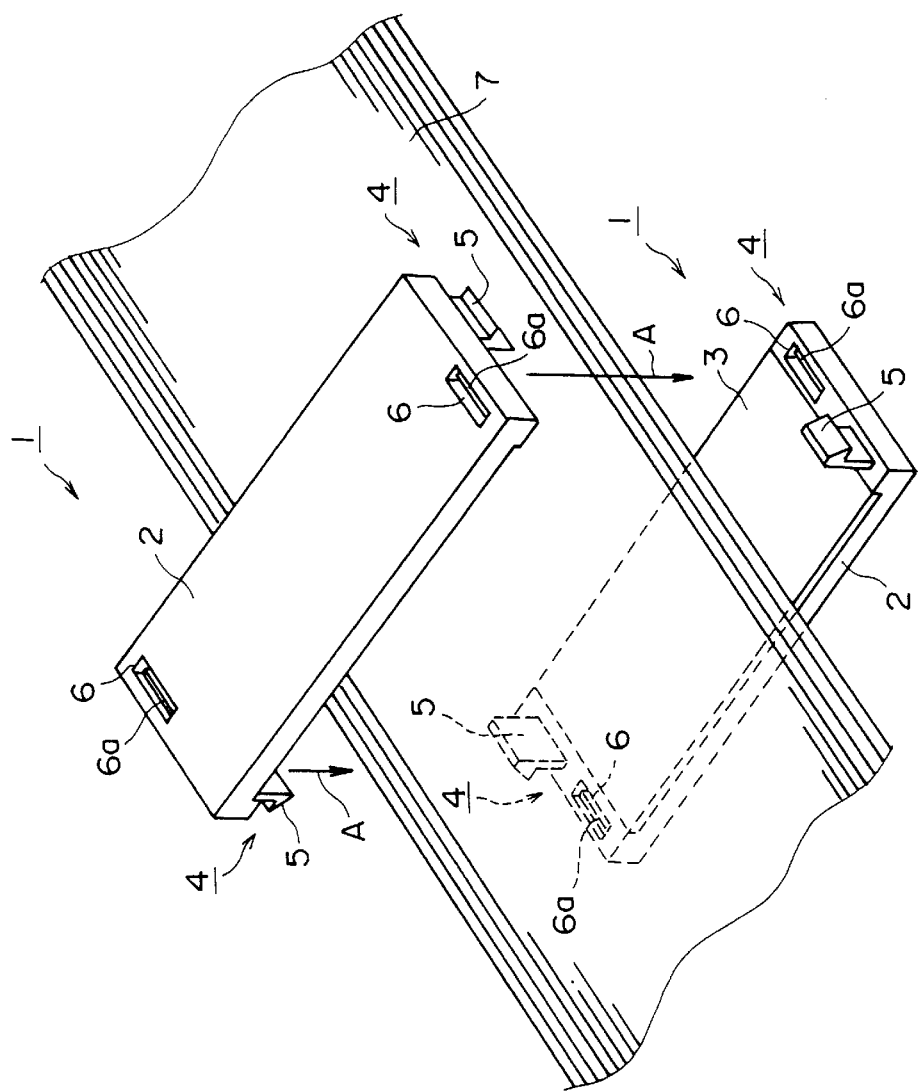
FIG. 2 is a perspective view depicting how the noise suppressing apparatus of this embodiment is applied to a flat cable.

Then, as FIG. 2 shows, the pair of case plates 2 are disposed at predetermined positions on the top and bottom faces of the assembled flat cable (hereafter FC) 7 which is connected to a predetermined terminal of an electronic equipment, which is not illustrated here. A predetermined position here means a position on the FC 7 where electromagnetic noise is leaking.

Then as arrow mark A shows, each latch 5 and latch hole 6, which are formed at each edge of the case plates 2 and are facing each other, are approached to each other in a vertical direction, the latch 5 is inserted into the facing latch hole 6, and the tip of the latch 5 is engaged with the step part 6a so that both are connected and locked.

Figure 3:
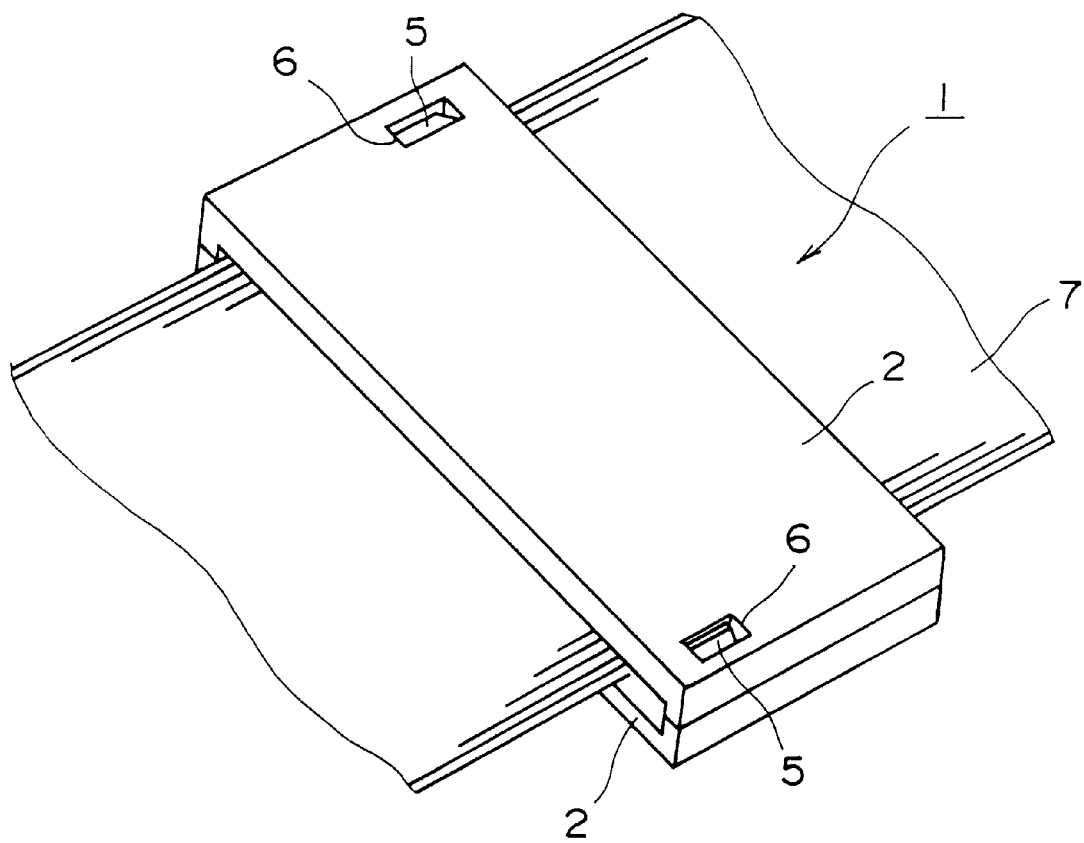
FIG. 3 is a schematic perspective view depicting a state when the noise suppressing apparatus of this embodiment is applied to the flat cable.

Thus, the pair of case plates 2 sandwich the flat cable (FC) 7 as shown in FIG. 3, where identical parts are denoted by the same numerals as FIG. 2. The latch 5 and the step part 6a of the latch hole 6 (FIG. 2) have been set such that the tip of the latch 5 does not extrude from the latch hole 6 when the latch 5 is engaged with the latch hole 6.

According to the noise suppressing apparatus 1 described above, the pair of case plates 2 where the ferrite plates 3, which have a high shielding effect, are glued, are disposed at the predetermined position of the FC 7 after FC 7 is assembled in an electronic equipment, and then these pairs of case plates are connected to each other. With this simple operation, the part of the FC 7 where electromagnetic noise is leaking can be covered with the pair of ferrite plates 3 and leakage of electromagnetic noise generated from the plate-shaped noise generating component can be completely prevented.

Figure 4:
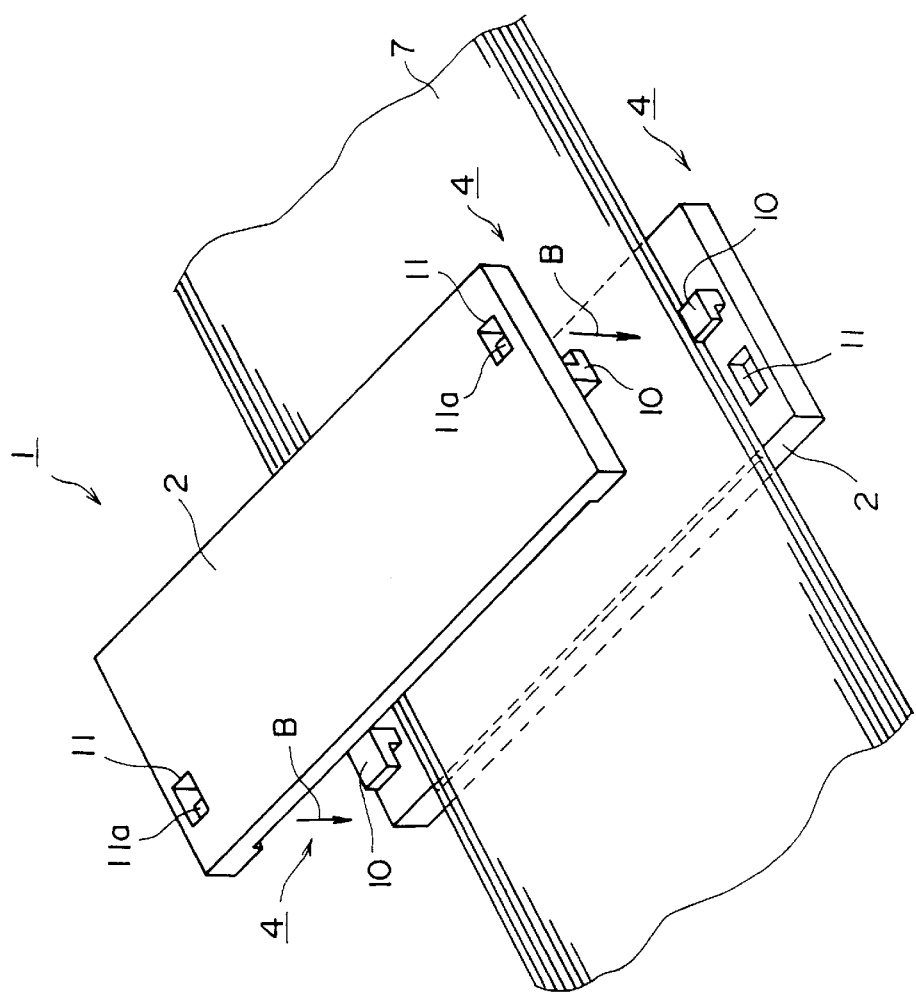
FIG. 4 is a schematic perspective view depicting how the noise suppressing apparatus of another embodiment is applied to a flat cable.

In the above embodiment, as FIG. 2 shows, the latching means 4 comprises the latches 5 formed on both sides of the case plates 2 and the latch holes 6 with which the latches 5 engage, and has a so-called vertical lock structure wherein one of the case plates 2, which are facing each other, is vertically lowered to the other case plate 2 and the latch 5 of the one case plate 2 are inserted into the latch holes 6 of the other case plate 2 for locking. However, the present invention is not restricted to the above mentioned embodiment, and as FIG. 4 shows, where identical parts are denoted by the same numerals as FIG. 2, the latching means 4 may comprise slide lock structured latches 10, where a pair of case plates 2 are approached to each other as shown by arrow mark B, and engage each other by sliding in a horizontal direction, and latch holes 11 in which step parts 11a are formed for the latches 10 to engage with.

Figure 5:
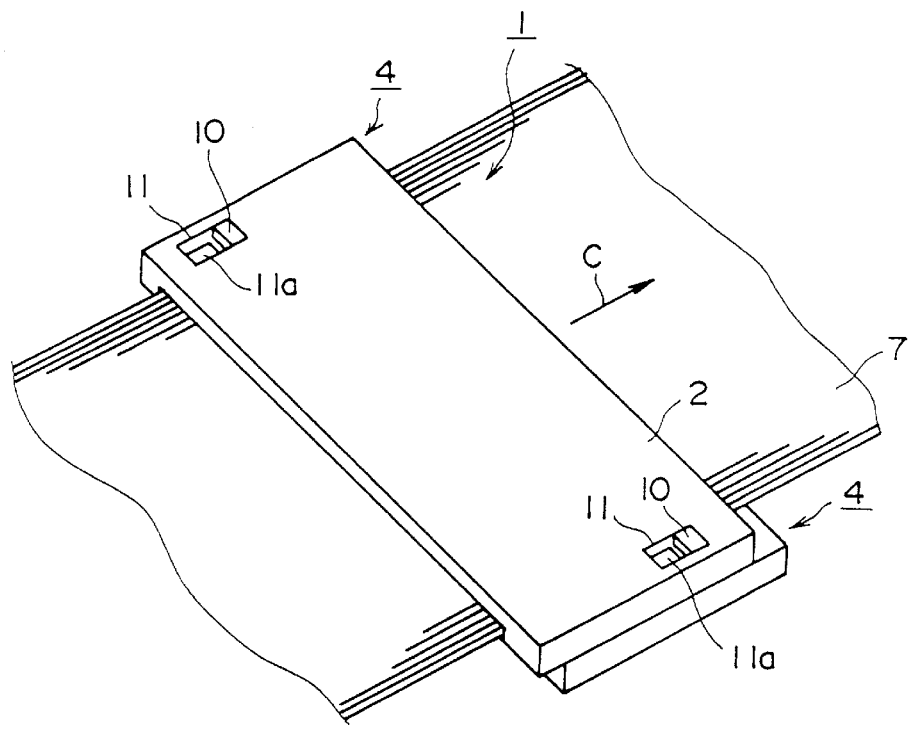
FIG. 5 is a schematic perspective view depicting a state when the noise suppressing apparatus of another embodiment is applied to the flat cable.
Figure 6:
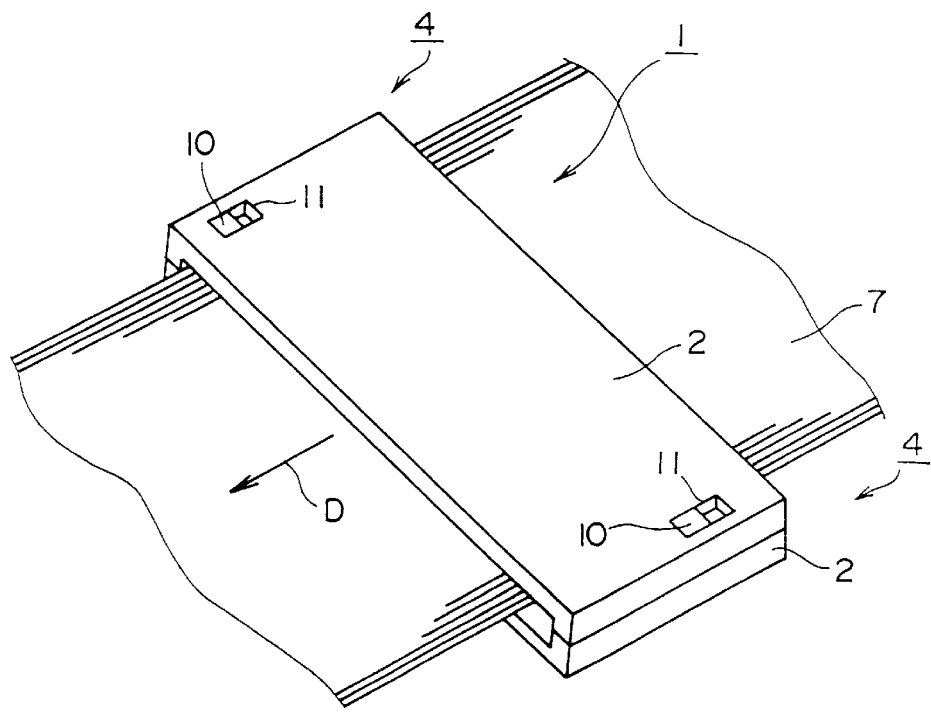
FIG. 6 is a schematic perspective view depicting a state when the noise suppressing apparatus of another embodiment is applied to the flat cable.

According to such a slide lock structured latching means 4, the latches 10 of the latching means 4 are inserted into the latch holes 11 in which the step parts 11a are formed, and one of the case plates 2 slides in the arrow C direction in parallel with the other case plate 2, as shown in FIG. 5. Then, the tips of the latches 10 are engaged and locked with the step parts 11a of the latch holes 11 and the flat cable (FC) 7 is firmly sandwiched with the pair of case plates 2. In this case, too, the length of the latches 10 and the position of the step parts 11a are set so that the tips of the latches 10 do not extrude from the inside of the latch holes 11.

If such a slide lock structured latching means is used, the lock is released merely by sliding the pair of case plates 2 in the direction indicated by arrow mark D, that is, the direction opposite from locking, in parallel, therefore releasing the lock is extremely easy.

In the above mentioned embodiments, the FC 7, that is, the flat cable 7, was used for an example as an object for which the pair of case plates 2 of the noise suppressing apparatus 1 prevent leakage of electromagnetic noise. However, the present invention is not restricted to the above embodiments, but may be applied to a flexible printed circuit board (FPC), or to other similar plate-shaped noise generating components.

Further, by forming the tips of each latch 5 and 10 of the latching means 4 to have a taper shape, strong engagement of the pair of case plates 2 can be obtained without rattling.

As described above, the noise suppressing apparatus of the present invention is so constructed that the pair of case plates, where ferrite plates, which are a sealing material, are glued on the surface, are engaged with each other, while sandwiching the top and bottom faces of the plate-shaped noise generating component, such as a flexible printed circuit board or a flat cable. With such construction, even when the noise suppressing apparatus is attached after the plate-shaped noise generating component, such as a flexible printed circuit board or a flat cable, is assembled into the electronic equipment, the flexible printed circuit board or the flat cable does not have to be detached, and as a consequence the installation operation of the noise suppressing apparatus is extremely easy. Also, since the plate-shaped ferrite, which can be easily formed to be thin, is used and the ferrite plates are glued to the case plates, the noise suppressing apparatus in general can be thin, which makes it easier to attach the noise suppressing apparatus in a slim and small space electronic equipment frame.

The present invention can be embodied in many other aspects, without deviating from the spirit of the major features, therefore the embodiments described herein are illustrative and not restrictive. The scope of the invention is indicated by the claims, and is not restricted by the descriptions herein. All variations and modifications which come within the meaning of the claims are intended to be embraced in the scope of the invention.

What is claimed is:

1. A noise suppressing apparatus adapted to cover top and bottom faces of a plate-shaped noise generating component so as to prevent leakage of electromagnetic noise generating from the noise generating component comprising:

a pair of separate case plates each having opposite first and second surfaces, a ferrite plate located upon the first surface of each of said pair of case plates, cooperative latching means at opposite ends of said pair of case plates for latching said pair of case plates together in conjunction with a noise generating component which is adapted to be sandwiched therebetween, said cooperative latching means including one of at least one latch and at least one latch hole at each end of each case plate, each said one latch being disposed on and projecting vertically from its associated case plate first surface, and a centerline distance between the latch and latch hole of the case plates are substantially identical whereby the case plates can be latched together with a noise generating component located therebetween by relatively moving the case plates along a path of travel substantially perpendicular to said first surfaces to thereby introduce each latch into an associated latch hole.

2. The noise suppressing apparatus as defined in claim 1 wherein each case plate has a latch at one of its ends and a latch hole at an opposite one of its ends.

3. The noise suppressing apparatus as defined in claim 1 wherein said latch and latch holes are constructed and arranged for latching together during relative movement of said case plates along said substantially perpendicular path of travel.

4. The noise suppressing apparatus as defined in claim 1 wherein said latch and latch holes are constructed and arranged for latching together after the relative movement of said case plates along said substantially perpendicular path of travel during further movement along a second path of travel substantially perpendicular to said first-mentioned perpendicular path of travel.

5. The noise suppressing apparatus as defined in claim 1 including a noise generating component located between said ferrite plates.

6. The noise suppressing apparatus as defined in claim 1 including a noise generating component located between said ferrite plates, and said noise generating component is a flat cable.

7. The noise suppressing apparatus as defined in claim 1 including a noise generating component located between said ferrite plates, and said noise generating component is a flexible printed circuit board.

8. The noise suppressing apparatus as defined in claim 3 wherein each said latch hole includes a step part which is latchingly engaged by said latch during relative movement of said case plates along said substantially perpendicular path of travel.

9. The noise suppressing apparatus as defined in claim 4 wherein each said latch hole includes a latch nose which latchingly engages with a latch hole during relative movement of said case plates along said substantially perpendicular second path of travel.

10. The noise suppressing apparatus as defined in claim 3 wherein each said case plate includes a latch and a latch hole at each of its ends.

11. The noise suppressing apparatus as defined in claim 8 wherein each said case plate has a latch at one of its ends and a latch hole at an opposite one of its ends.

12. The noise suppressing apparatus as defined in claim 8 wherein each said case plate includes a latch and a latch hole at each of its ends.

13. The noise suppressing apparatus as defined in claim 9 wherein each said case plate has a latch at one of its ends and a latch hole at an opposite one of its ends.

14. The noise suppressing apparatus as defined in claim 9 wherein each said case plate includes a latch and a latch hole at each of its ends.

* * * * *